United States Patent
Hirler

(10) Patent No.: US 7,741,675 B2
(45) Date of Patent: Jun. 22, 2010

(54) SEMICONDUCTOR COMPONENT AND METHOD FOR FABRICATING IT

(75) Inventor: Franz Hirler, Isen (DE)

(73) Assignee: Infineon Technologies Austria AG, Villach (AT)

( * ) Notice: Subject to any disclaimer, the term of this patent is extended or adjusted under 35 U.S.C. 154(b) by 555 days.

(21) Appl. No.: 11/361,045

(22) Filed: Feb. 23, 2006

(65) Prior Publication Data
US 2006/0209586 A1  Sep. 21, 2006

(30) Foreign Application Priority Data
Feb. 23, 2005  (DE) .................. 10 2005 008 354

(51) Int. Cl.
*H01L 11/24* (2006.01)
(52) U.S. Cl. .................. 257/330; 257/328; 257/329; 257/331; 257/332; 257/333; 257/334; 257/335; 257/336; 257/E29.201; 365/149
(58) Field of Classification Search ......... 257/328–336, 257/E29.201; 365/149
See application file for complete search history.

(56) References Cited
U.S. PATENT DOCUMENTS

| | | | | |
|---|---|---|---|---|
| 5,256,588 A | 10/1993 | Witek et al. | | |
| 5,321,289 A * | 6/1994 | Baba et al. | ................. | 257/331 |
| 6,815,767 B2 * | 11/2004 | Nakamura et al. | ......... | 257/330 |
| 7,087,958 B2 * | 8/2006 | Chuang et al. | ............. | 257/335 |
| 2003/0001202 A1 | 1/2003 | Kitamura | | |
| 2003/0146470 A1 * | 8/2003 | Hijzen et al. | ................ | 257/330 |

FOREIGN PATENT DOCUMENTS

| | | |
|---|---|---|
| DE | 100 51 909 A1 | 5/2002 |
| DE | 102 20 810 A1 | 11/2002 |
| EP | 1 300 886 A2 | 4/2003 |

* cited by examiner

*Primary Examiner*—Cuong Q Nguyen
*Assistant Examiner*—Trang Q Tran
(74) *Attorney, Agent, or Firm*—Maginot, Moore & Beck

(57) ABSTRACT

A semiconductor component has a semiconductor body in which a trench structure is provided. An electrode structure embedded in the trench structure is at least partly insulated from its surroundings by an insulation structure, and is contact-connected in a contact-connecting region via a contact hole that penetrates through an upper region of the insulation structure. The semiconductor component has at least two trenches running next to one another, at least one of said trenches containing a part of the electrode structure. The trenches are oriented so that at least the regions of the insulation structure which are provided in the upper region of the trenches overlap one another in an overlap region. The contact hole is arranged above the at least two trenches in such a way that at least parts of the overlap region and at least one of the electrode structure parts are contact-connected via the contact hole.

7 Claims, 6 Drawing Sheets

SEMICONDUCTOR COMPONENT AND METHOD FOR FABRICATING IT

BACKGROUND

The invention relates to a semiconductor component and to a method for fabricating said semiconductor component.

Trench transistors are frequently used semiconductor components. FIG. 1 shows a cross section through a detail from a known trench transistor.

A trench transistor 1 has a semiconductor body 2, in which a trench structure 3 is provided. An electrode structure 4 is embedded in the trench structure 3, said electrode structure 4 being insulated from its surroundings (semiconductor body 2) by an insulation structure 5. In this embodiment, the electrode structure 4 comprises gate electrodes by means of which current flows from source regions 6 through body regions 7 into a drift region 8 can be generated/controlled. The drift region 8 is adjoined by a highly doped drain region 9, which in turn adjoins a rear side terminal 10. The source and body regions 6, 7 are contact-connected by a front side terminal 11 (source terminal). In this case, the source regions 6 and also the drift region 8 and the drain region 9 are of one conduction type and the body regions 7 are of the other conduction type.

The electrode structure 4 is contact-connected within a contact-connecting region 12. For this purpose, firstly an insulation layer (upper part of the insulation structure 5) is applied to the surface of the semiconductor body 2 or the surface is thermally oxidized. A contact hole 13 penetrating through the insulation layer is subsequently produced. A contact-connecting terminal (here: gate terminal) 14 is then applied to the insulation layer 5, which contact-connecting terminal fills the contact hole 13 and makes contact with the electrode structure 4.

The contact-connecting method has the disadvantage that increasing miniaturization means that a precisely central alignment of the contact hole 13 with respect to the electrode structure 4 is not ensured. Thus, by way of example, FIG. 1 shows the case where the contact hole 13 is situated too far to the right, which has the consequence that the insulation structure 5 turns out to be thinner than desired within the region identified by reference numeral 15. This means, however, that there is the risk of a short circuit between the conductive material in the contact hole 13 and the body region 7 situated on the right next to the contact hole 13. If such a short circuit occurs, this may lead to the total failure of the trench transistor 1.

SUMMARY

One object on which the invention is based is to specify a semiconductor component and a method for fabricating said semiconductor component by which the above-described problems resulting from contact hole alignment tolerances in the contact-connection of electrode structures can be effectively reduced and/or avoided.

The semiconductor component according to at least some embodiments of the invention has a semiconductor body, in which a trench structure is provided, an electrode structure being embedded in the trench structure, said electrode structure being at least partly insulated from its surroundings by an insulation structure. The electrode structure is contact-connected in a contact-connecting region via a contact hole, penetrating through an upper region of the insulation structure. The semiconductor component has at least two trenches or trench regions running next to one another, at least one of said trenches/trench regions containing a part of the electrode structure, and the trenches/trench regions being oriented relative to one another in such a way that at least the regions of the insulation structure which are provided in the upper region of the trenches/trench regions overlap one another in an overlap region. The contact hole is arranged above the at least two trenches/trench regions in such a way that at least parts of the overlap region and at least one of the electrode structure parts are contact-connected via the contact hole.

Preferably, each trench/trench region contains a part of the electrode structure. This is not absolutely necessary, however; it suffices for only one of the trenches/trench regions to contain a part of the electrode structure. Those trenches/trench regions which do not contain a part of the electrode structure may be filled with insulating material, by way of example.

The semiconductor component according to some embodiments of the invention has the advantage that a contact-connecting region having a relatively large lateral extent is available as a result of the "merging" of at least the upper regions of the trenches/trench regions running next to one another (to put it more precisely as a result of the merging of corresponding insulation regions). This ensures that even in the event of a misalignment of a contact hole in the lateral direction, a minimum value of the lateral distance of the contact hole with respect to the regions of the semiconductor body which adjoin the contact-connecting region is not undershot. The thicknesses of the insulation layer regions of the insulation structure which insulate the contact hole from the semiconductor body are thus still sufficiently thick even in the event of alignment inaccuracy.

In one preferred embodiment, the at least two trenches/trench regions have the same dimensions as the cell array trenches of the semiconductor component. It is thus possible to fabricate the trenches/trench regions running within the contact-connecting region together with cell array trenches of the semiconductor component in one process step, and nevertheless to obtain a contact-connecting region which is wider than the lateral dimensions of a cell array trench.

Preferably, the contact hole is arranged in such a way that at least two electrode structure parts which are situated in different trenches/trench regions are simultaneously contact-connected via the contact hole. Given corresponding configuration of the trenches/trench regions, the electrode structure and also the contact hole, it is also possible for more than two mutually separate electrode structure parts to be simultaneously contact-connected via the contact hole.

The electrode structure part that is contact-connected via the contact hole may be for example part of a gate electrode structure. As an alternative, the electrode structure part that is contact-connected via the contact hole may be part of a field electrode structure. Furthermore, it is possible to make contact both with gate electrode structures and with field electrode structures within a contact-connecting region via a plurality of contact holes in the manner described above.

The trenches/trench regions running within the contact-connecting region and also the parts of the insulation structure which are provided in said trenches/trench regions may be configured in such a way that the trenches/trench regions running next to one another form a common trench or trench region, that is to say are merged to form a common, wide trench.

The invention furthermore provides a method for fabricating a contact-connecting region of an electrode structure provided in a semiconductor body of a semiconductor component, having the following steps:

formation of a trench structure in the semiconductor body, said trench structure having a contact-connecting region within which at least two trenches or trench regions running next to one another are provided, formation of an electrode structure embedded in the trench structure in such a way that at least one trench/trench region contains a part of the electrode structure, formation of an insulation structure which insulates the electrode structure from the surroundings thereof, in such a way that the parts of the insulation structure which are situated in the upper region of the trenches/trench regions overlap one another in an overlap region, the formation of the insulation structure being effected before and/or after the formation of the electrode structure, and formation of a contact hole above the at least two trenches/trench regions, which is arranged in such a way that at least parts of the overlap region and at least one electrode structure part are contact-connected via the contact hole.

Preferably, the at least two trenches/trench regions have the same dimensions as the cell array trenches of the semiconductor component and are fabricated together with the cell array trenches in one process step. The contact hole may, for example, be aligned in such a way that at least two electrode structure parts which are situated in different trenches/trench regions are simultaneously contact-connected via the contact hole.

The overlap region of the insulation structure may be formed for example by means of a thermal oxidation process which converts the upper parts of the semiconductor body which separate from one another two trenches running next to one another into an insulation layer.

If the trenches/trench regions are configured in such a way that they become narrower toward the bottom, that is to say are configured in a V-shaped manner, for example, then it is possible to have the effect that only the upper part of the semiconductor body region situated between the trenches/trench regions is completely oxidized during the oxidation. Accordingly, by way of the extent of the tapering of the trenches toward the bottom (that is to say the size of the V angle), it is possible to set the depth to which a complete oxidation of the semiconducting material between the trenches is to be effected (thickness of the overlap region). The oxidation may be effected before and/or after the formation of the electrode structure.

The invention may be used in particular for fabricating a contact-connecting region in a DMOS transistor. However, the invention is not restricted hereto; rather, the principle according to the invention may be applied to any desired trench components (in particular in the power semiconductor area).

BRIEF DESCRIPTION OF THE DRAWINGS

The invention is explained in more detail below in exemplary embodiment with reference to the figures, in which.

DESCRIPTION

Figure 1:
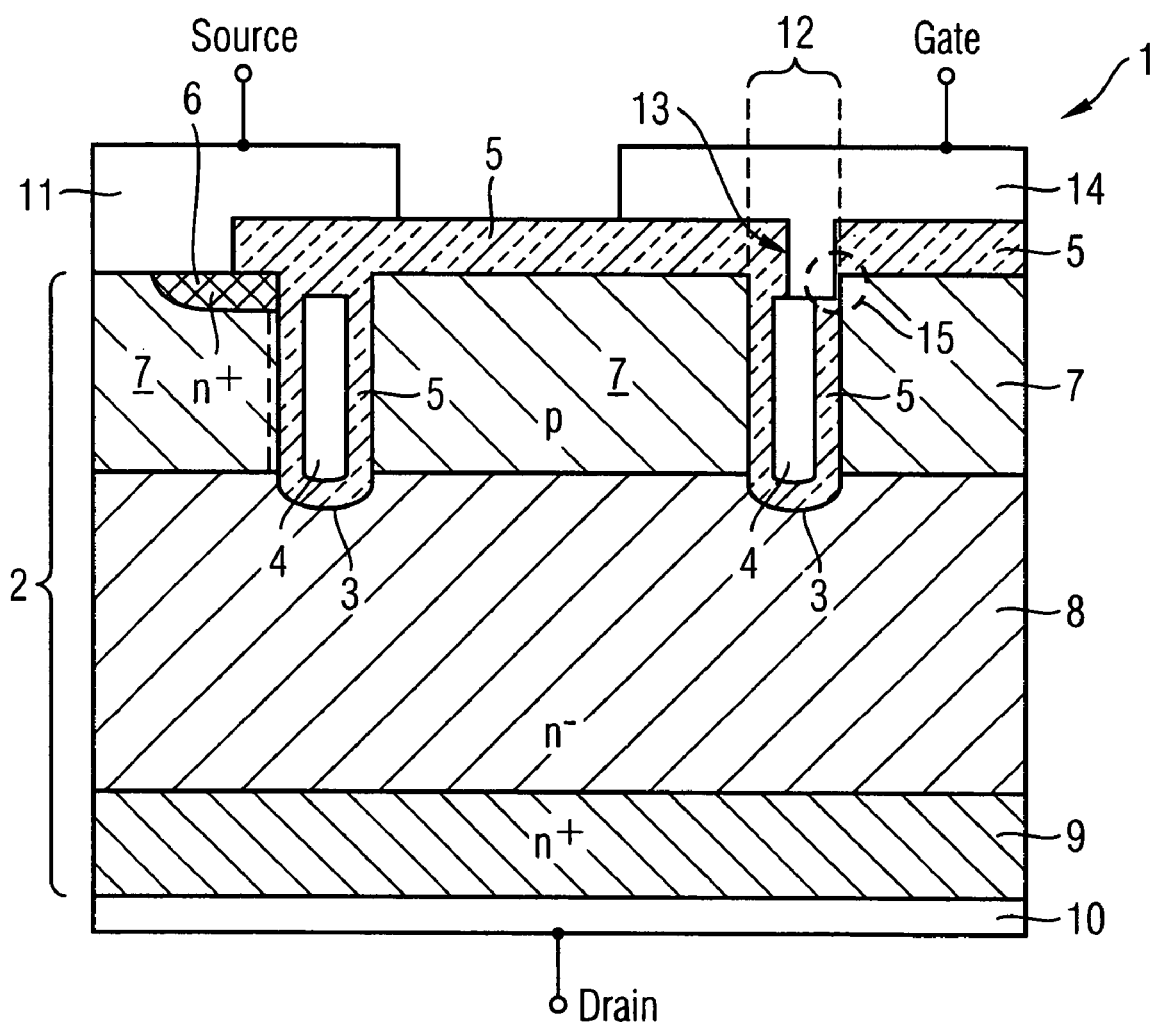
FIG. 1 shows a cross-sectional illustration of a detail from a known trench transistor.

In the figures, identical regions, components and component groups are identified by the same reference numerals. The doping types of all the embodiments may be configured inversely, that is to say that n-type regions may be replaced by p-type regions, and vice versa.

Figure 2:
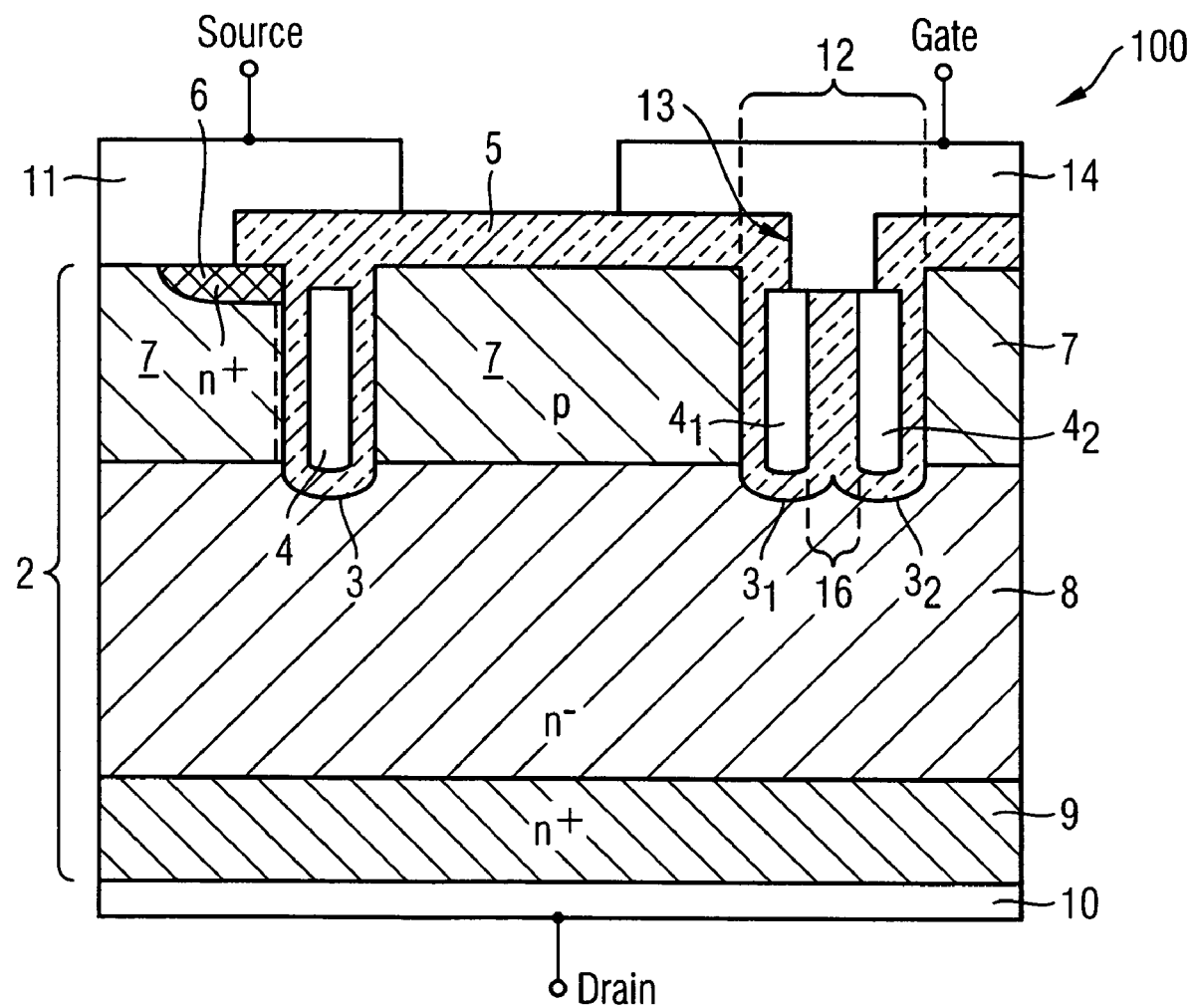
FIG. 2 shows a cross-sectional illustration of a detail from a first preferred embodiment of a semiconductor component according to the invention.

FIG. 2 shows a schematic cross-sectional illustration of a detail from a first preferred embodiment of the semiconductor component according to the invention.

The construction of the trench transistor 100 shown in FIG. 2 essentially responds to the trench transistor 1 described in connection with FIG. 1. An essential difference is that the trench transistor 100 has, in its contact-connecting region 12, two trenches $3_1$, $3_2$ "merged" with one another, an electrode structure part $4_1$, $4_2$ of the electrode structure 4 being provided in each of the trenches $3_1$, $3_2$. The parts of the insulation structure which face the respective other trench are merged with one another to form an insulation structure overlap region 16. It can clearly be seen that the contact-connecting region 12 in this embodiment is significantly wider than the corresponding contact-connecting region shown in FIG. 1. Even with high alignment tolerances, the contact hole 13 of this embodiment is still far enough away from the regions of the semiconductor body 2 which adjoins the trenches $3_1$, $3_2$. The contact hole 13 is preferably arranged centrally with respect to the overlap region 16, that is to say makes contact equally with the electrode structure part $4_1$ and the electrode structure part $4_2$. The two electrode structure parts $4_1$, $4_2$ are expediently connected to one another at a suitable location, so that it already suffices (misalignment) for only one of the electrode structure parts $4_1$, $4_2$ to be contact-connected via the contact hole 13.

Figure 3:
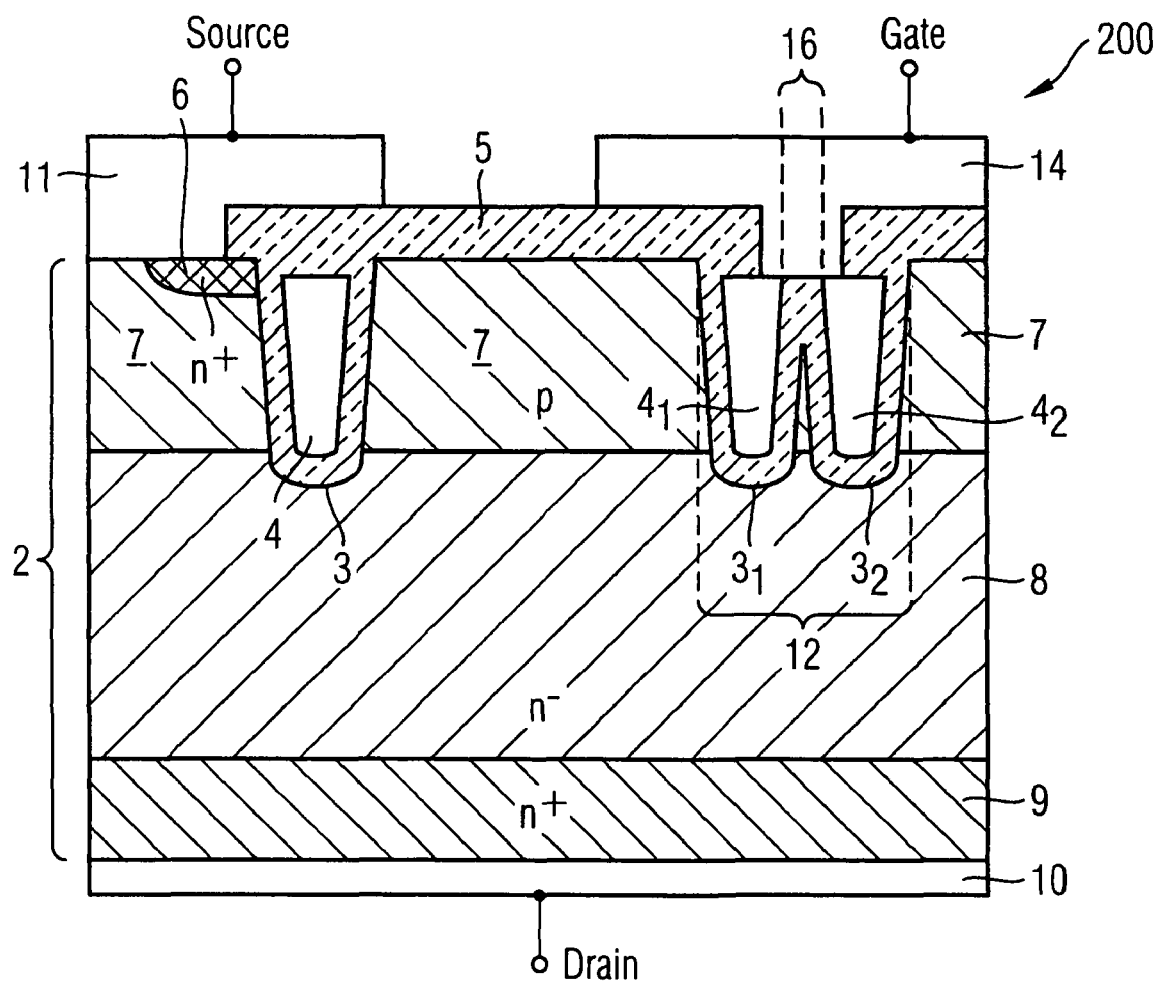
FIG. 3 shows a cross-sectional illustration of a detail from a second preferred embodiment of the semiconductor component according to the invention.

The embodiment shown in FIG. 3 differs from the embodiment shown in FIG. 2 essentially by virtue of the fact that only the regions of the insulation structure 5 which are provided in the upper region of the trenches $3_1$, $3_2$ overlap one another, but not the lower regions, since here the trenches $3_1$, $3_2$ are separated from one another by parts of the semiconductor body. The overlap regions 16 of the insulation structure 5 are preferably produced by means of an oxidation process which converts a part of the semiconductor body 2 that is provided between the trenches/trench regions into oxide. In this case, it must be taken into consideration that the width of the part of the semiconductor body that is situated between the trenches/trench regions $3_1$, $3_2$ is chosen to be thin enough that the oxidation process can bring about a complete oxidation within the overlap region 16. In the embodiment shown in FIG. 3, what is achieved by means of the V-shaped configuration of the trenches $3_1$, $3_2$, for example, is that only an upper part of the intermediate trench region (mesa region) is oxidized by the oxidation process.

Figure 4:
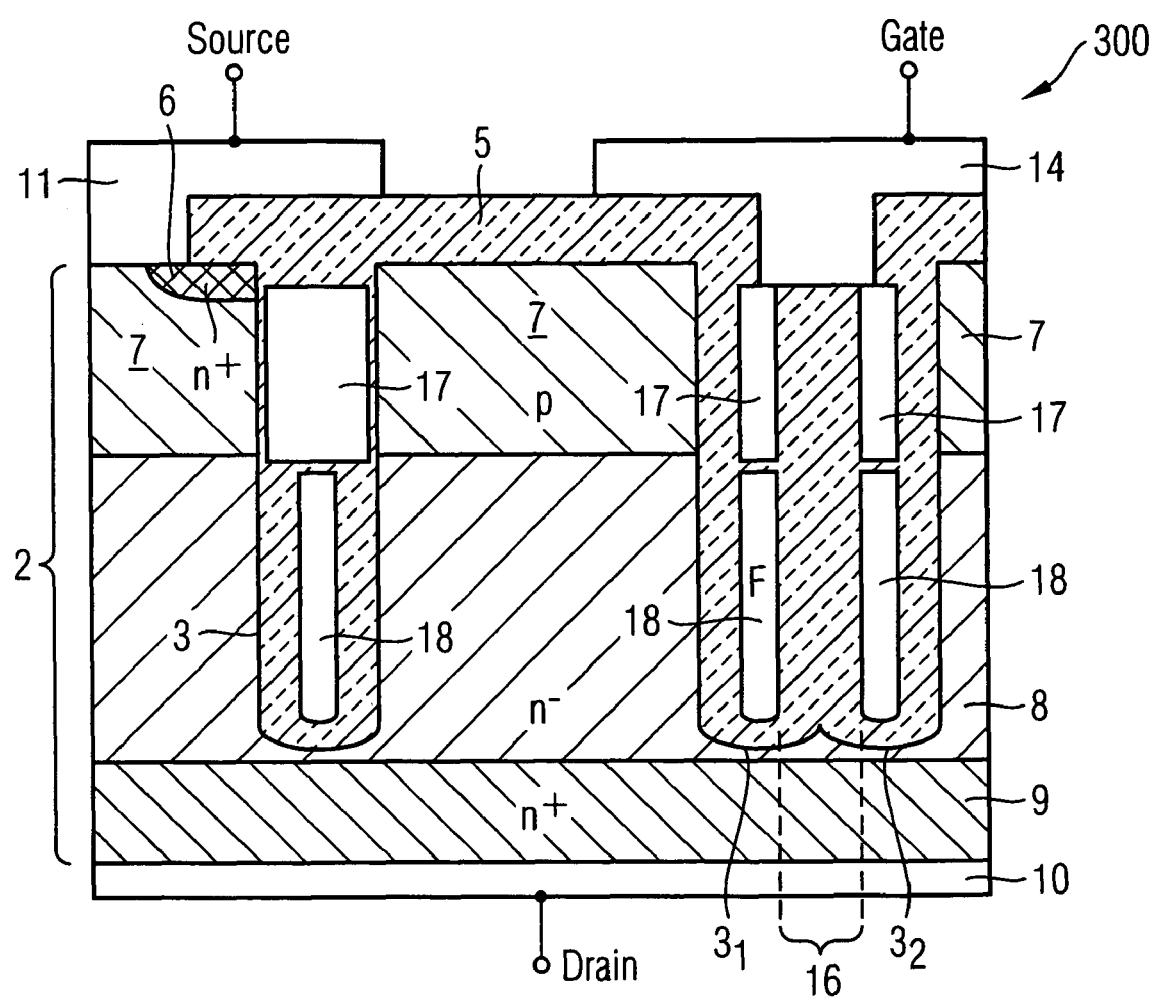
FIG. 4 shows a cross-sectional illustration of a detail from a third preferred embodiment of the semiconductor component according to the invention.

FIG. 4 shows a trench transistor 300 having bipartite electrodes both within the contact-connecting region 12 and in the cell array region (left-hand trench), an upper region of the electrodes in each case functioning as part of a gate electrode structure 17 and a lower region in each case constituting a part of a field electrode structure 18. In this embodiment, only the gate electrode structure 17 comprising the gate electrodes 17 is contact-connected by means of the contact hole 13. In this embodiment, the form of the trenches/trench regions $3_1$, $3_2$ and also their distance from one another where chosen in such a way that a complete oxidation of the mesa region situated between the trenches/trench regions could be effected.

Figure 5:
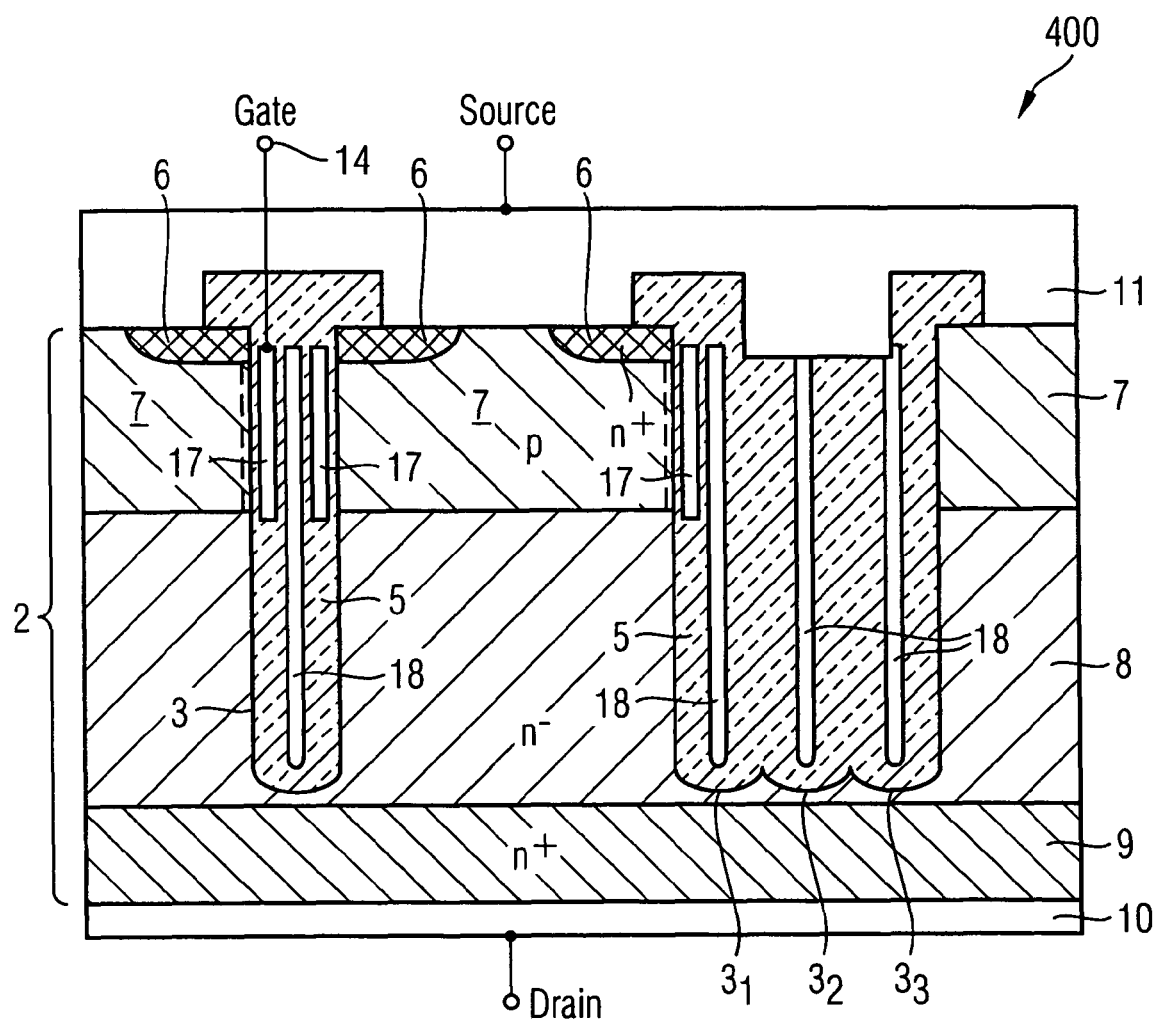
FIG. 5 shows a cross-sectional illustration of a detail from a fourth preferred embodiment of the semiconductor component according to the invention.

As can be seen in the case of the trench transistor 400 shown in FIG. 5, the field electrode structure 18 can also be contact-connected by means of the same principle. It is furthermore possible to make contact equally with the gate electrode structure 17 and the field electrode structure 18 via a plurality of contact holes.

Figure 6:
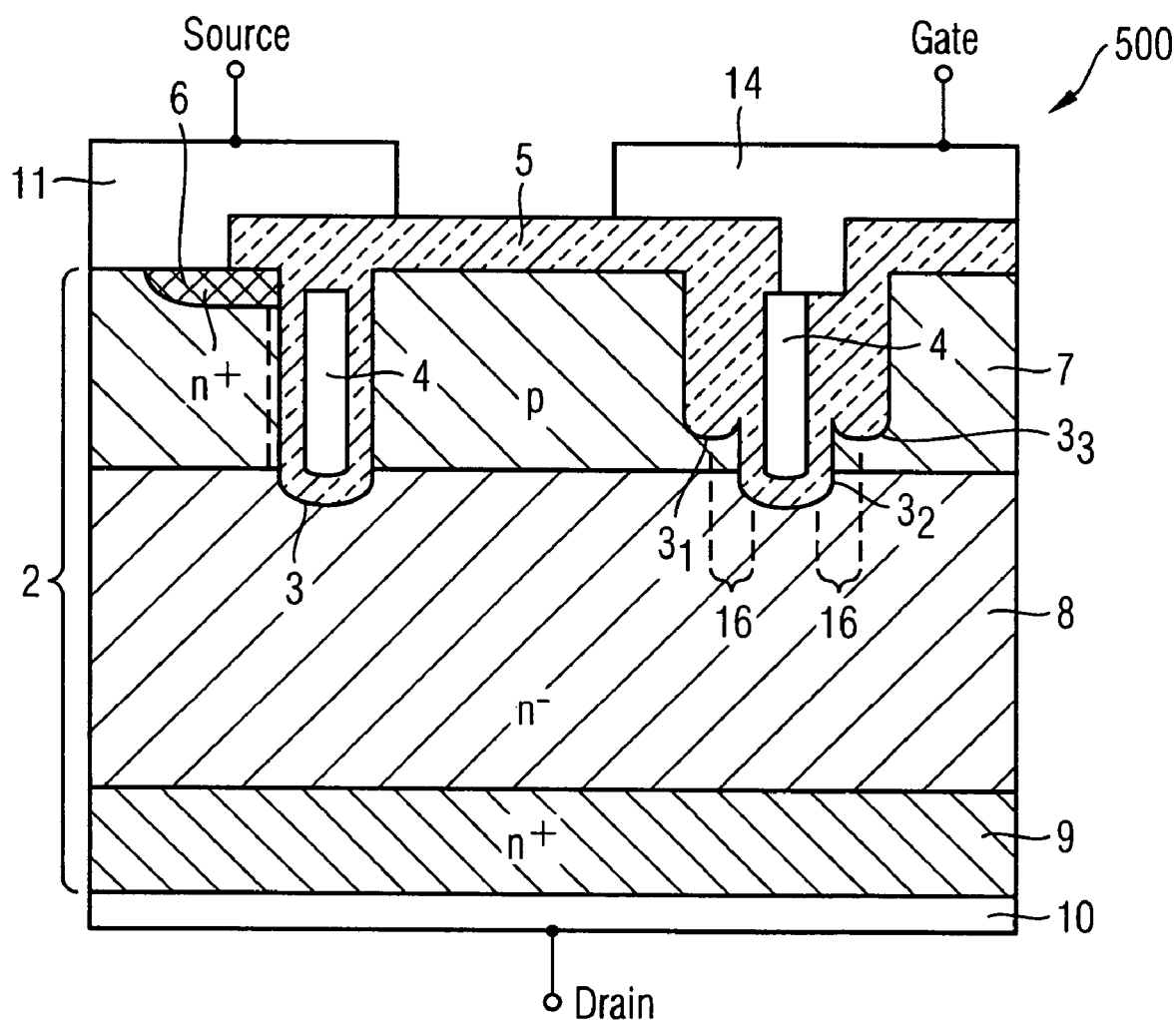
FIG. 6 shows a cross-sectional illustration of a detail from a fifth preferred embodiment of the semiconductor component according to the invention.

FIG. 6 shows a trench transistor 500 having three trenches $3_1$, $3_2$, $3_3$ running next to one another within the contact-connecting region, but only one of said trenches is provided with a part of the electrode structure 4 (trench $3_2$). The structure shown in FIG. 6 may be fabricated for example by fabricating the trenches $3_1$, $3_3$ with a smaller width than the trench $3_2$. An oxidation process is subsequently carried out, by means of which the narrow trenches $3_1$, $3_3$ are completely filled with insulating material (oxide), but a free space still remains within the wide trench $3_2$. Said free space is then filled with electrode material in order to form the region of the electrode structure 4 that is to be contact-connected. The trench transistor 500 thus has only one trench containing a part of an electrode structure within the contact-connecting region.

Further aspects of the invention will be explained in the description below:

In trench-DMOS transistors, the gate electrode running in the trenches, which is usually composed of polysilicon, has to be in contact with the metallic wiring plane in order that the potential can be applied externally via a gate pad that is normally realized in the metallic wiring plane. In ICs, too, gate potentials are transmitted by metal interconnects. This means that here, too, the metal interconnect has to be directly connected to the gate poly or the contact has to be produced by means of vias (e.g. made of tungsten). However, since the trench and contact holes usually have the same minimum lithography dimension, it is difficult, owing to the misalignment of the different lithography planes with respect to one another, to realize the contact hole directly above the gate poly, or not to thin the trench sidewall insulation layer between the contacts at gate potential and the silicon which usually carries drain voltage.

In order to combat this problem, the gate poly can be drawn to the Si surface via the trench edge and the contact-connection can be carried out at the surface. In order that the surface is not completely etched free of poly, however, a further lithography plane is required, whereby the topographical outlay rises which makes later process steps more difficult. As an alternative, the contact-connecting trenches can be widened. However, this makes it more difficult to fill the trenches with the gate poly. In this case, the deposited poly layer has to be made thicker in order also to fill the widened trenches. As a result, the poly etching-back of the gate electrode under the Si edge becomes less accurate, which leads to increased variations in the gate-source capacitance and also the threshold voltage and likewise increases the process costs due to longer deposition and etching times. Moreover, trenches of different widths cause additional problems in production. Thus, "Black Silicon" (silicon needles that are produced by micromasking during the etching process and may lead to reliability problems) occurs more frequently in wide trenches. Moreover, wider trenches are also etched deeper, which may lead to a reduction of the breakdown voltage.

According to the invention, a plurality of trenches are arranged next to one another in the contact-connecting region in such a way that the insulation of the trenches "merges" with one another at least in the upper trench region. Consequently, either one or a plurality of gate electrode contact zones can be simultaneously contact-connected. In the event of misalignment or an excessively large width of the contact holes, it is ensured that the minimum insulation distance between gate and drain potential is achieved. An advantage is that in the fabrication process it is possible to dispense with a lithography step in the etching-back of the gate electrode and at the same time to work with cell array trench widths. Small poly layer thicknesses can thereby be realized.

What is claimed is:

1. A semiconductor component comprising:
   semiconductor body including a trench structure embedded in a top surface of said semiconductor body, the trench structure including at least two trench regions disposed adjacent to each other and oriented perpendicular to said top surface, at least one trench region of said at least two trench regions including at least a part of an electrode structure, said electrode structure being embedded in the trench structure and at least partly insulated from surroundings of the electrode structure by an insulating structure,
   wherein the at least two trench regions have approximately the same dimensions as cell array trenches of the semiconductor component;
   wherein the two trench regions are oriented relative to one another in such a way that at least upper regions of said two trench regions and at least a portion of the insulating structure overlap one another in an overlap region, said portion of said insulating structure being provided in the upper region of the two trench regions; and
   wherein a contact hole is arranged above the at least two trench regions in such a way that at least parts of the overlap region and at least said part of the electrode structure are physically and electrically connect via the contact hole.

2. The semiconductor component as claimed in claim 1, wherein the contact hole is arranged in such a way that at least two parts of said electrode structure are situated in different trench regions of the at least two trench regions.

3. The semiconductor component as claimed in claim 1, wherein distances between the two trench regions, dimensions of the two trench regions and also the insulating structure are configured in such a way that the two trench regions form a common trench.

4. A trench transistor having a semiconductor body, the trench transistor comprising:
   at least two trenches which are embedded in a top surface of said semiconductor body and adjacent each other in a contact-connecting region of the semiconductor body, each trench being oriented perpendicular to said top surface and including:
     an electrode structure; and
     an insulation structure configured to at least partly insulate the electrode structure from surrounding areas; and
   a contact hole formed above the at least two trenches in the contact-connecting region;
   wherein said at least two trenches have approximately the same dimensions as cell array trenches of the trench transistor:
   wherein upper portions of said at least two trenches and portions of the insulation structures of the at least two trenches are merged to form an insulation structure overlap region; and wherein the contact hole is configured to physically and electrically connect the electrode structures of the at least two trenches and at least a part of the insulation structure overlap region.

5. The trench transistor as claimed in claim 4, wherein the contact hole is arranged centrally with respect to the insulation structure overlap region such that the contact hole makes contact substantially equally with each of the electrode structures of the at least two trenches.

6. The trench transistor of claim 1, wherein the at least two trench regions includes first and second trench regions, and wherein the first trench region includes at a bottom thereof an ascending wall portion that intersects with an ascending wall portion of the second trench region.

7. The trench transistor of claim 2, wherein the portion of the insulating structure extends in an elongated manner toward the top surface of the semiconductor body between said at least two parts of the electrode structure located within said at least two adjacent trench regions.

* * * * *